(12) United States Patent
Yoon et al.

(10) Patent No.: US 11,967,847 B2
(45) Date of Patent: Apr. 23, 2024

(54) BATTERY BANK CONTROL DEVICE AND METHOD

(71) Applicant: LG ENERGY SOLUTION, LTD., Seoul (KR)

(72) Inventors: Sung Yul Yoon, Daejeon (KR); Yoon Joon Choi, Daejeon (KR); Hae In Choi, Daejeon (KR); Jae Sung Im, Daejeon (KR); Hyo Seok Lee, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 481 days.

(21) Appl. No.: 17/432,482

(22) PCT Filed: Mar. 16, 2020

(86) PCT No.: PCT/KR2020/003594
§ 371 (c)(1),
(2) Date: Aug. 19, 2021

(87) PCT Pub. No.: WO2020/189998
PCT Pub. Date: Sep. 24, 2020

(65) Prior Publication Data
US 2022/0140618 A1 May 5, 2022

(30) Foreign Application Priority Data
Mar. 21, 2019 (KR) .................. 10-2019-0032430

(51) Int. Cl.
*H02J 7/00* (2006.01)
*G01R 31/374* (2019.01)
(Continued)

(52) U.S. Cl.
CPC .......... *H02J 7/0048* (2020.01); *G01R 31/374* (2019.01); *G01R 31/3835* (2019.01);
(Continued)

(58) Field of Classification Search
CPC ..................................... H02J 7/0048
(Continued)

(56) References Cited

U.S. PATENT DOCUMENTS 5,606,243 A 2/1997 Sakai et al.
2005/0110498 A1 5/2005 Plett
(Continued)

FOREIGN PATENT DOCUMENTS

CN 1883097 A 12/2006
CN 104348256 A 2/2015
(Continued)

OTHER PUBLICATIONS

International Search Report issued in corresponding International Patent Application No. PCT/KR2020/003594 dated Jun. 24, 2020.
(Continued)

*Primary Examiner* — Jerry D Robbins
(74) *Attorney, Agent, or Firm* — Morgan, Lewis & Bockius LLP (57) ABSTRACT

A battery bank control device is provided for setting a power limit value of a battery bank in which a plurality of battery racks (BRs) are connected in parallel. The device includes: a voltage measurement unit measuring a voltage of each BR of the plurality of BRs; a first power limit calculation unit calculating a first power limit value according to a state of charge (SOC) calculated based on the voltage of each BR with respect to each BR; a capacity ratio calculation unit calculating a capacity ratio of each BR based on capacity information of the plurality of BRs; a second power limit calculation unit calculating a second power limit value using the capacity ratio and the first power limit value of each BR; and a battery bank power limit calculation unit calculating a battery bank power limit value using the second power limit value of each BR.

11 Claims, 8 Drawing Sheets

(51) Int. Cl.
  *G01R 31/3835* (2019.01)
  *H01M 10/42* (2006.01)
  *H01M 10/48* (2006.01)
  *H01M 50/204* (2021.01)

(52) U.S. Cl.
  CPC ......... *H01M 10/425* (2013.01); *H01M 10/48* (2013.01); *H01M 10/482* (2013.01); *H01M 10/486* (2013.01); *H01M 50/204* (2021.01); *H02J 7/0013* (2013.01); *H02J 7/007* (2013.01); *H01M 2010/4271* (2013.01); *H01M 2220/10* (2013.01)

(58) Field of Classification Search
  USPC .......................................................... 320/126
  See application file for complete search history.

(56) References Cited

U.S. PATENT DOCUMENTS

| | | |
|---|---|---|
| 2007/0090802 A1 | 4/2007 | Seo |
| 2007/0090803 A1 | 4/2007 | Yun et al. |
| 2010/0217466 A1 | 8/2010 | Ichikawa |
| 2012/0242289 A1 | 9/2012 | Boehm |
| 2014/0079960 A1 | 3/2014 | Yun |
| 2014/0239900 A1* | 8/2014 | Abe ................... H01M 10/482 320/118 |
| 2014/0306519 A1 | 10/2014 | Song |
| 2016/0197514 A1 | 7/2016 | Li et al. |
| 2016/0301234 A1 | 10/2016 | Park et al. |
| 2017/0054303 A1 | 2/2017 | Choi et al. |
| 2017/0324256 A1 | 11/2017 | McMorrow et al. |
| 2017/0371000 A1 | 12/2017 | Fukushima et al. |
| 2018/0120361 A1* | 5/2018 | Choi ................... H02J 7/00302 |
| 2018/0143252 A1 | 5/2018 | Kondo |
| 2019/0334356 A1 | 10/2019 | Hidaka |

FOREIGN PATENT DOCUMENTS

| | | |
|---|---|---|
| CN | 105745811 A | 7/2016 |
| EP | 2 769 872 A1 | 8/2014 |
| JP | 7-263034 A | 10/1995 |
| JP | 2009-44930 A | 2/2009 |
| JP | 2012-178953 A | 9/2012 |
| JP | 2013-508674 A | 3/2013 |
| JP | 2013-233010 A | 11/2013 |
| JP | 5616254 B2 | 10/2014 |
| JP | 2015-116098 A | 6/2015 |
| JP | 2016-163400 A | 9/2016 |
| JP | 2018-129887 A | 8/2018 |
| JP | 2018-191500 A | 11/2018 |
| JP | 2019-30110 A | 2/2019 |
| KR | 10-2007-0043150 A | 4/2007 |
| KR | 10-2008-0021401 A | 3/2008 |
| KR | 10-2012-0065707 A | 6/2012 |
| KR | 10-2014-0035799 A | 3/2014 |
| KR | 10-2016-0109530 A | 9/2016 |
| KR | 10-2017-0022416 A | 3/2017 |
| KR | 10-2017-0071949 A | 6/2017 |
| KR | 10-2018-0047179 A | 5/2018 |
| KR | 10-2018-0072353 A | 6/2018 |
| WO | 2016/079964 A1 | 5/2016 |

OTHER PUBLICATIONS

Extended European Search Report dated Jul. 22, 2022 issued by the European Patent Office in corresponding European Patent Application No. 20773303.1.

Office Action dated Sep. 26, 2022 issued by the Japanese Patent Office in corresponding Japanese Patent Application No. 2021-549118.

Office Action dated Aug. 19, 2023, issued in corresponding Chinese Patent Application No. 202080016652.8.

* cited by examiner

|  | Unit Cell | | Module (Cell 2P14S) | | Rack (Module 17STACK) | | Rack Max Power |
|---|---|---|---|---|---|---|---|
| | CAPACITY (Ah) | ENERGY (Wh) | CAPACITY (Ah) | ENERGY (kWh) | CAPACITY (Ah) | ENERGY (kWh) | |
| JP1 (Generation 1) | 27 | 98 | 54 | 2.744 | 54 | 46 | 92kW(2CP) |
| JP3 (Generation 2) | 64 | 235.5 | 128 | 6.594 | 128 | 112 | 224kW(2CP) |

BATTERY BANK CONTROL DEVICE AND METHOD

TECHNICAL FIELD

Mutual Citations with Related Applications

This application claims the benefit of priority based on Korean Patent Application No. 10-2019-0032430 dated Mar. 21, 2019, and all contents disclosed in the literature of the Korean patent application are incorporated as part of this specification.

Technical Field

The present invention relates to a battery bank control device and method.

Background Art

Recently, research and development on secondary batteries have been actively conducted. Here, the secondary batteries, as batteries that can be charged and discharged, mean that they include conventional Ni/Cd batteries and Ni/MH batteries, and recent lithium ion batteries. Among the secondary batteries, the lithium ion battery has an advantage that the energy density is much higher than that of the conventional Ni/Cd battery and Ni/MH battery, and further, the lithium ion battery can be manufactured with a tendency of a small size so that it is used as a power source for a mobile apparatus. In addition, the usage range of the lithium ion battery extends as a power source for electric vehicles, so that the lithium ion battery attracts attention as a next generation energy storage medium.

In addition, a secondary battery is generally used as a battery pack including a battery module in which a plurality of battery cells are connected in series and/or in parallel. And, a state and an operation of a battery pack are managed and controlled by a battery management system.

Moreover, such a plurality of battery modules are connected in series/parallel to form a battery rack, and a plurality of battery racks are connected in parallel to form a battery bank. Such a battery bank can be used as an energy storage system (ESS). Among these ESSs, grid-oriented ESSs often have a long performance guarantee period due to business characteristics. Therefore, when one of the battery racks in the ESS is broken, or battery capacity is insufficient, the battery rack is added. When a battery rack is added in such a way, the time gap between the existing battery rack and the newly added battery rack may differ in version, and this causes an imbalance in output current distribution due to the difference in capacity. In addition, the battery bank power limit value calculated by the conventional battery bank power limit logic may cause an over power problem due to unbalanced distribution of output current distribution between battery racks.

DISCLOSURE

Technical Problem

An object of the present invention is to improve the maximum output efficiently by resolving the imbalance of output current distribution between battery racks caused when a new battery rack is added in the ESS or when some of existing battery racks are deteriorated.

Technical Solution

According to an embodiment of the present invention, a battery bank control device for setting a power limit value of a battery bank in which a plurality of battery racks are connected in parallel includes: a voltage measurement unit configured to measure a voltage of each battery rack of the plurality of battery racks; a first power limit calculation unit configured to calculate a first power limit value according to SOC calculated based on the voltage of the each battery rack with respect to the each battery rack; a capacity ratio calculation unit configured to calculate a capacity ratio of the each battery rack based on capacity information of the plurality of battery racks; a second power limit calculation unit configured to calculate a second power limit value using the capacity ratio and the first power limit value of the each battery rack; and a battery bank power limit calculation unit configured to calculate a battery bank power limit value using the second power limit value of the each battery rack.

According to an embodiment of the present invention, the battery bank control device further includes a SOC calculation unit for calculating the SOC of the each battery rack based on the voltage of the each battery rack.

In the battery bank control device according to an embodiment of the present invention, the SOC of the each battery rack is a value that changes in real time, and accordingly, the bank power limit value also changes in real time.

The battery bank control device according to an embodiment of the present invention further includes a temperature measurement unit for measuring the temperature of the each battery rack of the plurality of battery racks, wherein when calculating the SOC of the each battery rack, the temperature of the each battery rack is used.

In the battery bank control device according to an embodiment of the present invention, the second power limit calculation unit calculates the second power limit value by dividing the first power limit value of the each battery rack by the capacity ratio for the battery rack.

In the battery bank control device according to an embodiment of the present invention, the bank power limit calculation unit calculates the smallest value among the second power limit values of the each battery rack as the bank power limit value.

According to an embodiment of the present invention, a method of setting power limit of a battery bank in which a plurality of battery racks are connected in parallel includes: measuring a voltage of each battery rack of the plurality of battery racks; calculating a first power limit value according to SOC calculated based on the voltage of the each battery rack with respect to the each battery rack; calculating a capacity ratio of the each battery rack based on capacity information of the plurality of battery racks; calculating a second power limit value using the capacity ratio and the first power limit value of the each battery rack; and calculating a battery bank power limit value using the second power limit value of the each battery rack.

In the battery bank control method according to an embodiment of the present invention, the SOC of the each battery rack is a value that changes in real time, and accordingly, the bank power limit value also changes in real time.

The battery bank control method according to an embodiment of the present invention further includes measuring the temperature of the each battery rack of the plurality of battery racks, wherein when calculating the SOC of the each battery rack, the temperature of the each battery rack is used.

The calculating of the second poser limit value of the battery bank control method according to an embodiment of the present invention includes calculating the second power limit value by dividing the first power limit value of the each battery rack by the capacity ratio for the battery rack.

The calculating of the battery bank power limit value of the battery bank control method according to an embodiment of the present invention includes calculating the smallest value among the second power limit values of the each battery rack as the bank power limit value.

Advantageous Effects

The present invention has an effect of enabling full output by setting a power limit value of a battery bank using a capacity ratio between battery racks.

BEST MODE

Hereinafter, various embodiments of the present invention are disclosed with reference to the accompanying drawings. However, this is not intended to limit the invention to the specific embodiments, and it is to be understood that the invention includes various modifications, equivalents, and/or alternatives. With respect to the descriptions of the drawings, like reference numerals refer to like elements.

Terms used herein is for the purpose of describing particular example embodiments only and is not intended to be limiting of the scope of other embodiments. The terms of a singular form may include plural forms unless they have a clearly different meaning in the context. Otherwise indicated herein, all the terms used herein, which include technical or scientific terms, may have the same meaning that is generally understood by a person skilled in the art. In general, the terms defined in the dictionary should be considered to have the same meaning as the contextual meaning of the related art, and, unless clearly defined herein, should not be understood as having an ideal or excessively formal meaning. In any cases, even the terms defined in this specification cannot be interpreted as excluding embodiments of the present invention.

In addition, in describing the components of the embodiment of the present invention, terms such as first, second, A, B, (a), and (b) may be used. These terms are only to distinguish the components from other components, and the nature, sequence, or order of the components are not limited by the terms. In addition, when a component is described as being "connected to", "coupled to" or "linked to" another component, the components may be directly connected to or linked to each other but it should be understood that other components may be "connected", "coupled", or "linked" between each component.

Figure 1:
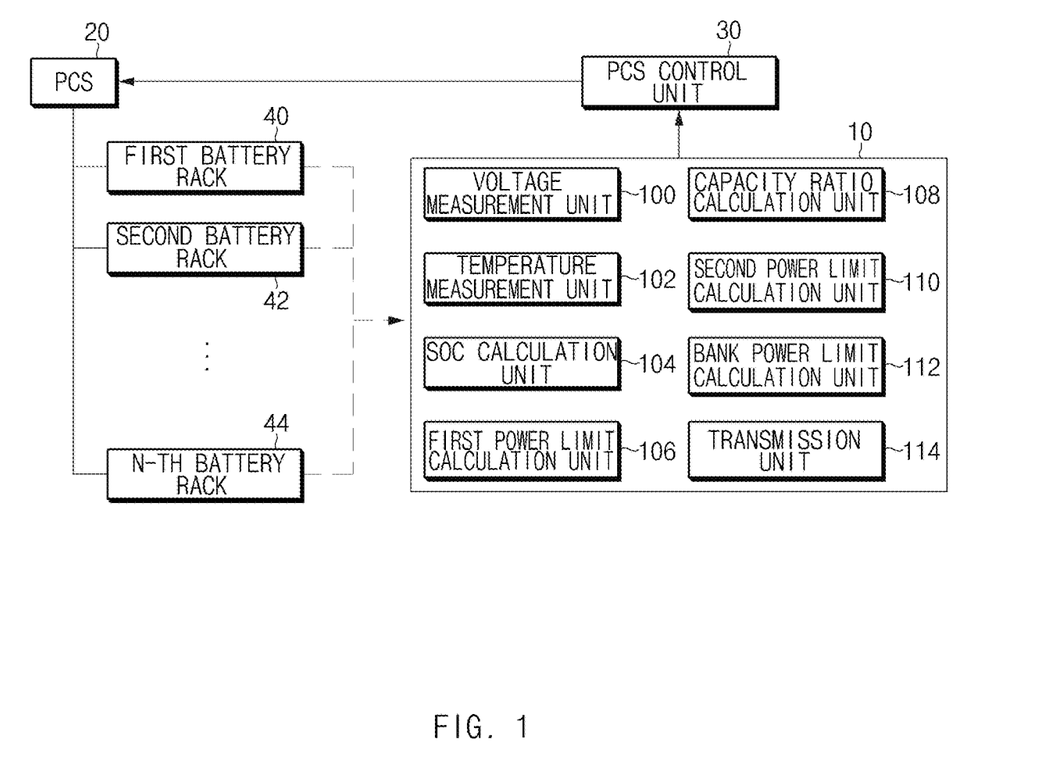
FIG. 1 shows a battery bank power limit calculation device according to an embodiment of the present invention.

FIG. 1 shows a battery bank power limit calculation device 10 according to an embodiment of the present invention. The battery bank power limit calculation device is also called a battery bank control device.

The battery bank power limit calculation device includes a voltage measurement unit 100, a temperature measurement unit 102, an SOC calculation unit 104, a first power limit calculation unit 106, a capacity ratio calculation unit 108, a second power limit calculation unit 110, a battery bank power limit calculation unit 112, and a transmission unit 114.

In the battery bank, a plurality of battery racks 40 to 44 are connected in parallel. Each battery rack may be homogeneous or heterogeneous. Alternatively, even if each battery rack is the same type, the life may be different.

The voltage measurement unit 100 measures the voltage of each of the battery racks 40 to 44 in real time. The voltage of each battery rack measured in the voltage measurement unit 100 is transmitted to the SOC calculation unit 104. In one embodiment of the present invention, a voltage measurement unit 100 is included, but a current measurement unit may be included instead of the voltage measurement unit 100.

When the current measurement unit is included, the current value of each battery rack measured by the current measurement unit can be transmitted to the SOC calculation unit 104.

The temperature measurement unit 102 measures the temperature of each of the plurality of battery racks in real time. The temperature measurement unit 102 may be a thermistor, for example. The temperature measurement unit 102 transmits the measured temperature value of each battery rack to the SOC calculation unit 104. Since this is also influenced by the temperature of the capacity of the battery, the real-time measured temperature value of the battery can be reflected when calculating the remaining capacity of the battery.

The SOC calculation unit 104 receives the voltage value of each of the battery racks 40 to 44 measured from the voltage measurement unit 100. In addition, the SOC calculation unit 104 receives the temperature value of each of the battery racks 40 to 44 measured from the temperature measurement unit 100.

The SOC calculation unit 104 calculates the SOC value of each of the battery racks 40 to 44 using the received voltage value of each of the battery racks 40 to 44. At this time, since the voltage of the battery is greatly affected by the temperature of the battery, when calculating the SOC using the battery voltage, the battery temperature value may also be considered.

In addition, a current measurement unit may be included in place of the voltage measurement unit 100. At this time, the current measurement unit may transmit the current value of each of the battery racks 40 to 44 to the SOC calculation unit 104. Subsequently, the SOC calculation unit 104 receiving the current value of each battery rack 40 to 44 from the current measurement unit integrates the current value of each of battery racks 40 to 44 with respect to a certain time to calculate SOC values for each of the battery racks 40 to 44.

However, the method of calculating the SOC by measuring the voltage or current of the battery rack has been described above, but can be replaced with a method of calculating an SOC such as other chemical methods or pressure measurement methods.

The first power limit calculation unit 106 receives the SOC value of each of the battery racks 40 to 44 from the SOC calculation unit 104. The first power limit calculation unit 106 calculates a power limit value according to the SOC value of each of the battery racks 40 to 44. The first power limit calculation unit 106 calculates a first power limit value according to the SOC value of each of the battery racks 40 to 44 calculated. The first power limit value according to the SOC value corresponds to a minimum value among charging and discharging power according to the SOC of the battery rack. Here, the charging/discharging power limit value may be suggested according to SOC. For example, at 50% SOC, the charging power limit may be 100 kW, and the discharging power limit may be 100 kW, and at 100% SOC, the charging power limit may be 0 kW, and the discharging power limit may be 100 kW, and at 0% SOC, the charging power limit may be 100 kW, and the discharge power limit may be 0 kW.

The first power limit calculation unit 106 transmits the calculated first power limit value of each of the battery racks 40 to 44 to the second power limit calculation unit 110.

The capacity ratio calculation unit 108 calculates the capacity ratio of the corresponding battery rack to the total capacity of the plurality of battery racks. That is, the capacity ratio of the corresponding battery rack is calculated based on the capacity information of each of the plurality of battery racks. The capacity ratio calculation unit 108 calculates all the capacity ratios of the corresponding battery rack to the capacity of each total battery rack of the plurality of battery racks. For example, information on the state of health (SOH) and capacity necessary for the capacity ratio calculation unit 108 to calculate the capacity ratio of the battery rack may be stored in a battery management system (BMS) (not shown). The capacity ratio calculation unit 108 transmits the calculated capacity ratio of each battery rack to the second power limit calculation unit 112.

The second power limit calculation unit 110 receives the first power limit value of each of the battery racks 40 to 44 from the first power limit calculation unit 106. In addition, the second power limit calculation unit 110 receives the capacity ratio of each of the battery racks 40 to 44 from the capacity ratio calculation unit 108.

The second power limit calculation unit 110 divides the first power limit value of each battery rack by the capacity ratio of the corresponding battery rack. That is, the second power limit calculation unit 110 calculates a value obtained by dividing the first power limit value of each battery rack by the capacity ratio of the corresponding battery rack as the second power limit value of each battery rack.

The second power limit calculation unit 110 transmits the calculated second power limit value of each battery rack to the bank power limit calculation unit 112.

The bank power limit calculation unit 112 receives the second power limit value of each of the battery racks 40 to 44 from the second power limit calculation unit 110.

The bank power limit calculation unit 112 calculates the smallest value of each received second power limit value as the bank power limit value.

When the bank power limit calculation unit 112 transmits the calculated bank power limit value to the transmission unit 114, the transmission unit 114 transmits the bank power limit value to a power conversion system (PCS) control unit 30.

The PCS control unit 30 receiving the bank power limit value from the transmission unit 114 controls the PCS 20 based on the received bank power limit value.

Figure 2:
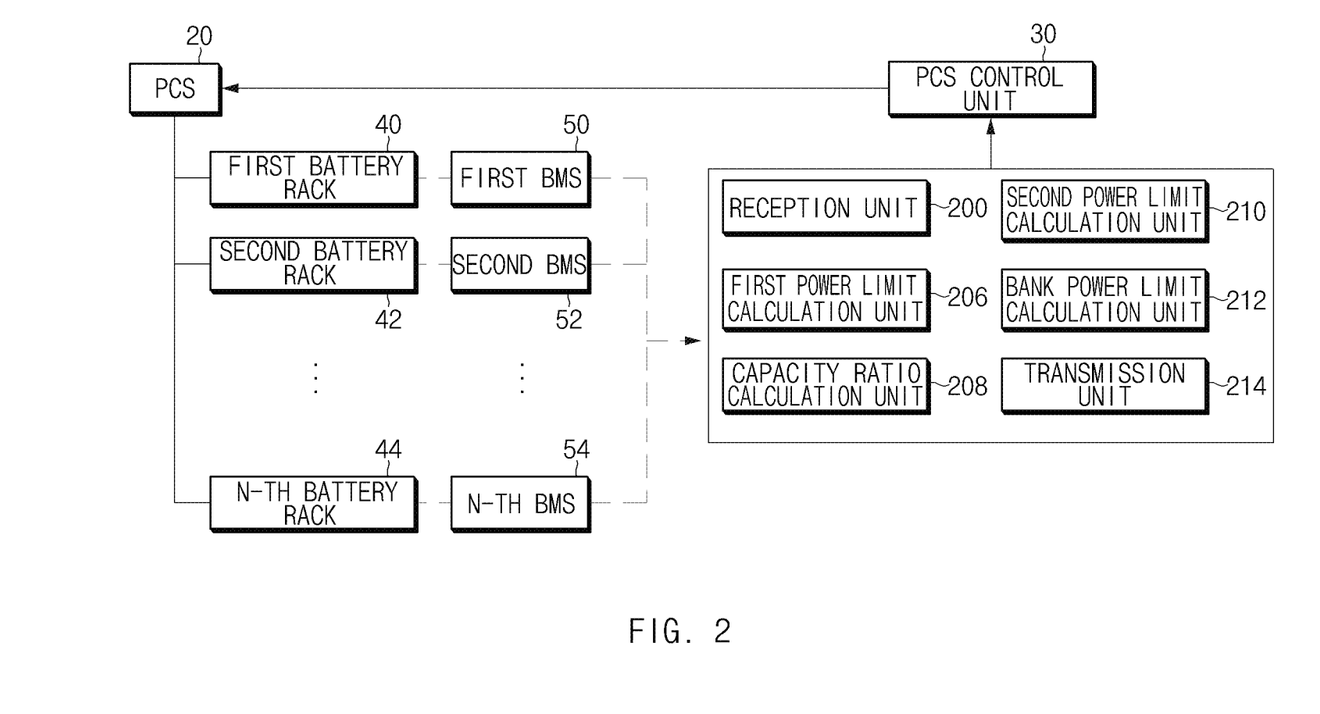
FIG. 2 shows a battery bank power limit calculation device according to another embodiment of the present invention.

FIG. 2 shows a battery bank power limit calculation device 11 according to another embodiment of the present invention.

The battery bank power limit calculation device 11 according to another embodiment of the present invention includes a reception unit 200, a first power limit calculation unit 206, a capacity ratio calculation unit 208, a second power limit calculation unit 210, a bank power limit calculation unit 212, and transmission unit 214.

A battery management system that controls or monitors each battery rack is connected to each battery rack. Each of battery management systems 50 to 54 measures the voltage or current of each battery cell in a battery rack to which the corresponding battery management system is connected to calculate a power limit according to SOC of each battery cell. In addition, each of the battery management systems 50 to 54 transmits the power limit value according to the real-time SOC of the battery cells included in the battery rack to the battery bank power limit calculation device 11.

The reception unit 200 receives a power limit value according to a real-time SOC of each of a plurality of battery cells in a battery rack to which the corresponding battery management system is connected, from each of the battery management systems 50 to 54. The reception unit 200 transmits the power limit value according to the received real-time SOC of the battery cells in each battery rack to the first power limit calculation unit 206.

The first power limit calculation unit 206 receives a power limit value according to a real-time SOC of each of a plurality of battery cells in each battery rack from the reception unit 200. The first power limit calculation unit 206 calculates the smallest value among the power limit values of the battery cells in the corresponding battery rack as the power limit value of the corresponding battery rack by using the power limit value according to the received real-time SOC of each of the plurality of battery cells in each battery rack. The first power limit calculation unit 206 calculates the power limit of the battery rack as the first power limit of the battery rack.

The first power limit calculation unit 206 transmits the first power limit value calculated for each battery rack to the second power limit calculation unit 210.

The capacity ratio calculation unit 208 calculates the capacity ratio of the corresponding battery rack to the total capacity of the plurality of battery racks. The capacity ratio calculation unit 208 calculates all the capacity ratios of the corresponding battery rack to the capacity of each total battery rack of the plurality of battery racks. For example, information on the SOH and capacity necessary for the capacity ratio calculation unit 208 to calculate the capacity ratio of the battery rack may be stored in each of battery management systems 50 to 54. The capacity ratio calculation unit 208 transmits the calculated capacity ratio of each battery rack to the second power limit calculation unit 210.

The second power limit calculation unit 210 receives the first power limit value of each of the battery racks 40 to 44 from the first power limit calculation unit 206. In addition, the second power limit calculation unit 210 receives the capacity ratio of each of the battery racks 40 to 44 from the capacity ratio calculation unit 208.

The second power limit calculation unit 210 divides the first power limit of each battery rack by the capacity ratio of the corresponding battery rack. The second power limit calculation unit 210 calculates a value obtained by dividing the first power limit of each battery rack by the capacity ratio of the corresponding battery rack as the second power limit value of each battery rack.

The second power limit calculation unit 210 transmits the calculated second power limit value of each battery rack to the bank power limit calculation unit 212.

The bank power limit calculation unit 212 receives the second power limit value of each of the battery racks 40 to 44 from the second power limit calculation unit 210.

The bank power limit calculation unit 212 calculates the smallest value of each received second power limit value as the bank power limit value.

When the bank power limit calculation unit 212 transmits the calculated bank power limit value to the transmission unit 214, the transmission unit 214 transmits the bank power limit value to a PCS control unit 30.

The PCS control unit 30 receiving the bank power limit value from the transmission unit 214 controls the PCS 20 based on the received bank power limit value.

Figure 3A:
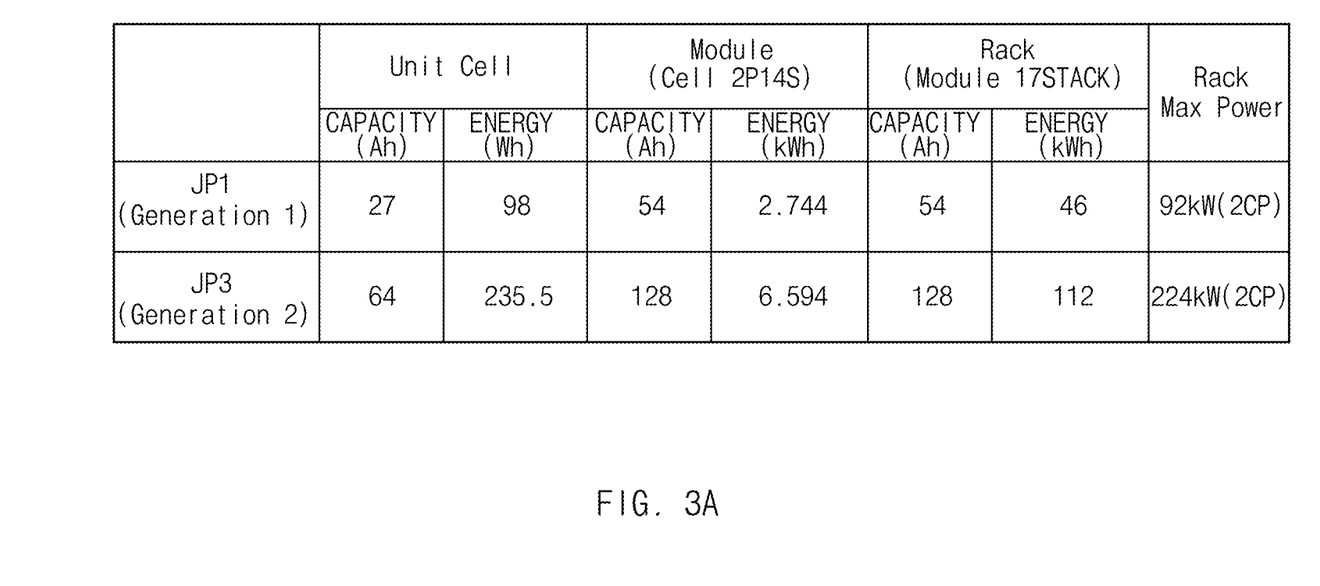
FIG. 3a shows exemplary capacity and energy values of a battery cell.

FIG. 3a shows exemplary capacity and energy values of a battery cell.

Figure 3B:
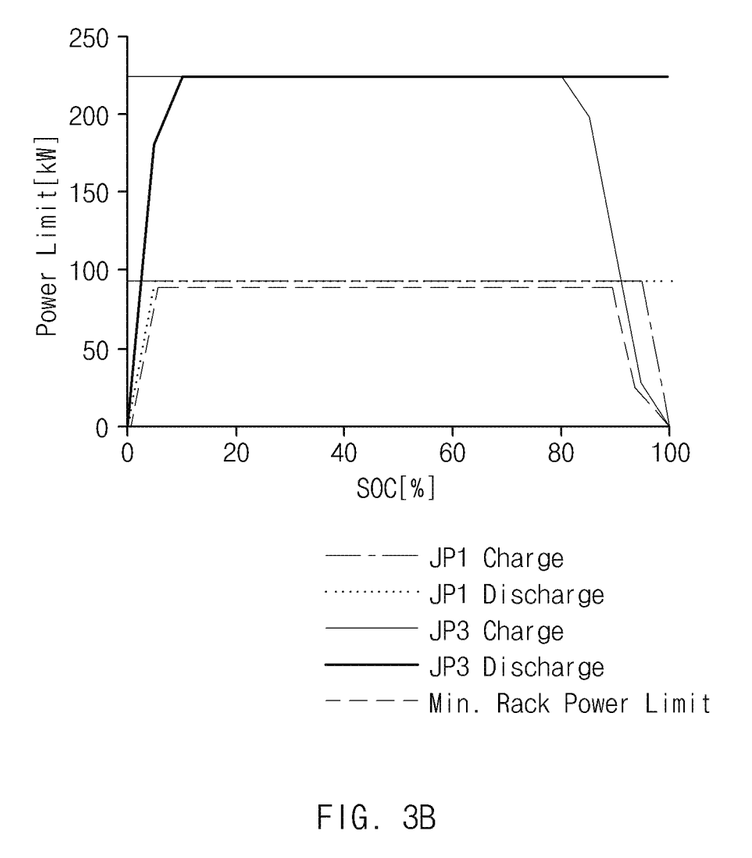
FIG. 3b is a first power limit value derived graph calculated by a bank power limit calculation unit according to another embodiment of the present invention.

In addition, FIG. 3b is a first power limit value derived graph calculated by the bank power limit calculation unit 212 according to another embodiment of the present invention.

As shown in the table shown in FIG. 3a, the intrinsic properties of each battery cell are different, and their capacity and energy are also different.

Accordingly, as shown in the graph shown in FIG. 3b, the power limit value according to SOC varies for each battery cell. At this time, for example, the power limit of the battery rack including the battery cell JP1 and the battery cell JP3 is a graph in which the minimum value of the power limit of each battery cell is indicated by a dotted line. The first power limit of the bank battery power limit calculation device 11 according to another embodiment of the present invention of FIG. 2 may be obtained by obtaining a power limit value that is a value corresponding to the dotted line of the graph shown in FIG. 3b.

Figure 4:
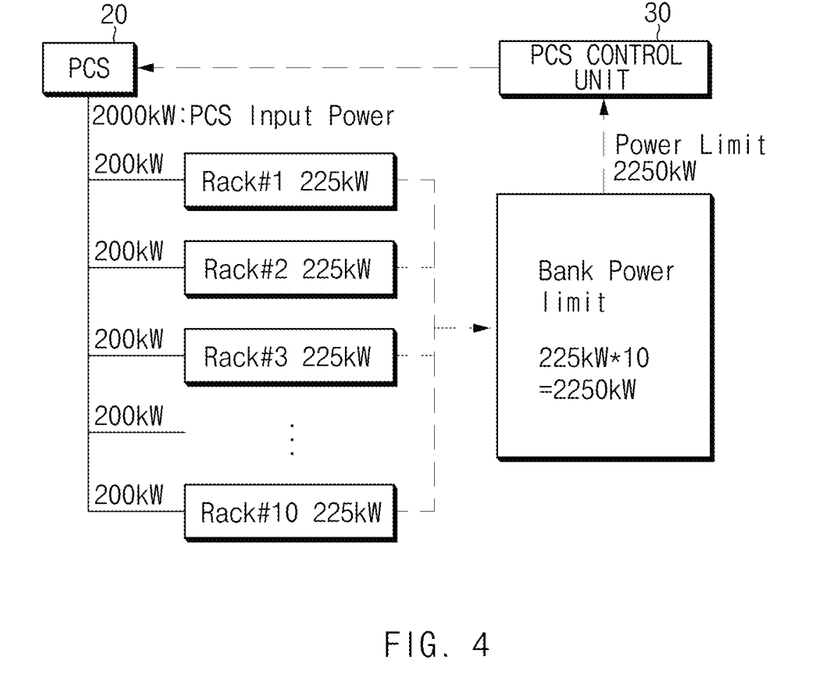
FIG. 4 shows a conventional bank power limit calculation method according to a connection state of a battery rack.

FIG. 4 shows a conventional bank power limit calculation method according to a connection state of a battery rack.

FIG. 4 is a conventional bank power limit calculation method, and the power limit of each battery rack is 225 kW, for example, and each input power is 200 kW, and power is applied within the power limit of each battery rack, and all battery racks are in a normal state. Therefore, since all battery racks are connected to the battery bank, the power limit of the battery rack is multiplied by the number of battery racks to calculate the bank power limit.

Figure 5:
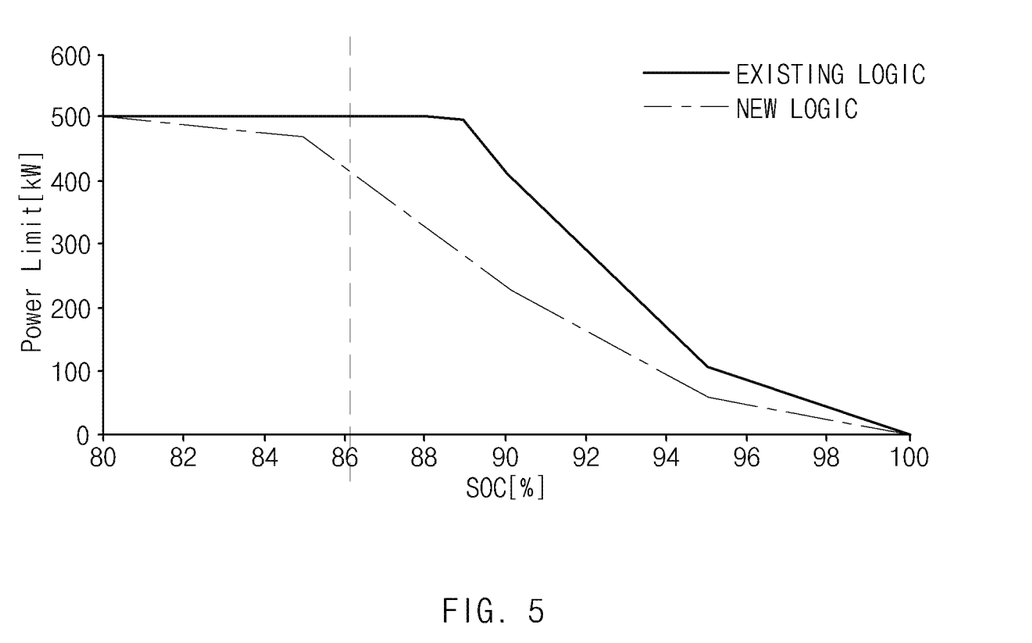
FIG. 5 shows a bank power limit graph according to the SOC calculated using the existing bank power limit calculation logic (existing logic), and a bank power limit graph according to SOC calculated using the bank power limit calculation logic (new logic) according to the present invention.

Referring to FIG. 5, a bank power limit graph according to the SOC calculated using the existing bank power limit calculation logic (existing logic) is illustrated, and a bank power limit graph according to SOC calculated using the bank power limit calculation logic (new logic) according to the present invention is illustrated.

In this case, the bank power limit according to the SOC calculated using the existing bank power limit calculation logic (logic that multiplies the same power limit value by the number of battery racks without considering capacity) is different in each battery rack type, or is calculated without considering the different capacities, so that an overcharging problem occurs in a certain SOC section.

On the other hand, since the bank power limit according to the SOC calculated using the bank power limit calculation logic according to the present invention is calculated and set in consideration of the type and capacity of each battery rack, the output distribution is balanced so that the overcharging problem can be solved and the maximum output can be achieved.

Figure 6:
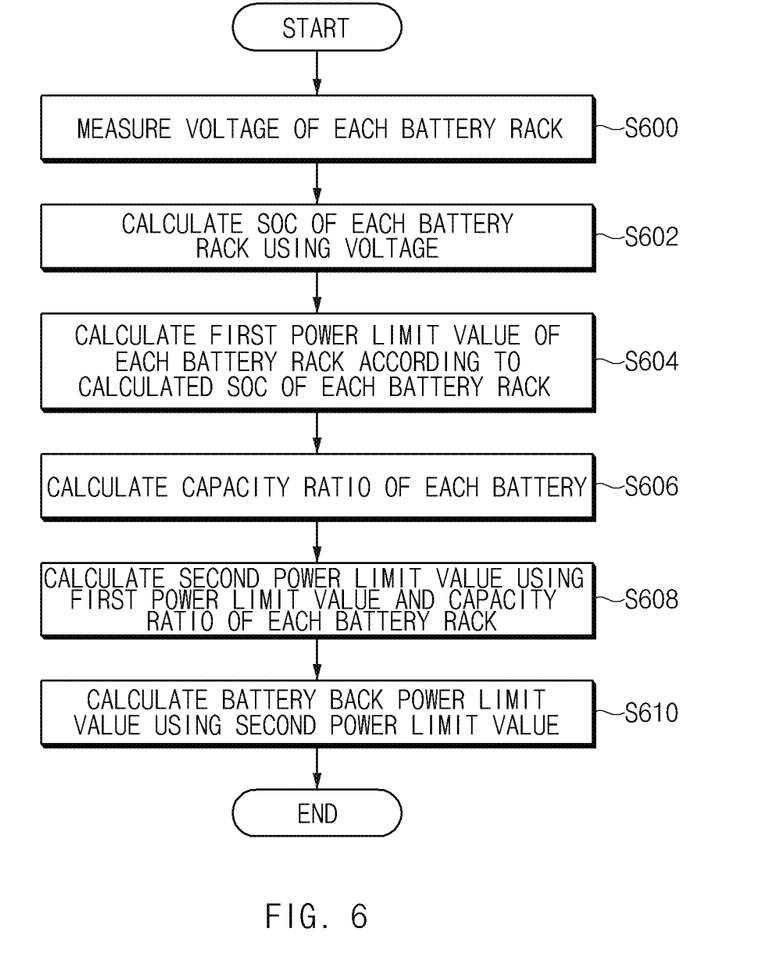
FIG. 6 is a flowchart of a method of calculating a battery bank power limit according to an embodiment of the present invention.

FIG. 6 is a flowchart of a method of calculating a battery bank power limit according to an embodiment of the present invention.

In the battery bank, a plurality of battery racks 40 to 44 are connected in parallel. Each battery rack may be homogeneous or heterogeneous. Alternatively, even if each battery rack is the same type, the life may be different.

The voltage measurement unit 100 measures the voltage of each of the battery racks 40 to 44 in real time (S600). The voltage of each battery rack measured in the voltage measurement unit 100 is transmitted to the SOC calculation unit 104. In one embodiment of the present invention, a voltage measurement unit 100 is included, but a current measurement unit may be included instead of the voltage measurement unit 100.

The SOC calculation unit 104 receives the voltage value of each of the battery racks 40 to 44 measured from the voltage measurement unit 100. The SOC calculation unit 104 calculates the SOC value of each of the battery racks 40 to 44 using the received voltage value of each of the battery racks 40 to 44 (S602). At this time, since the voltage of the battery is greatly affected by the temperature of the battery, when calculating the SOC using the battery voltage, the battery temperature value may also be considered.

The first power limit calculation unit 106 receives the SOC value of each of the battery racks 40 to 44 from the SOC calculation unit 104. The first power limit calculation unit 106 calculates a power limit value according to the SOC value of each of the battery racks 40 to 44. The first power limit calculation unit 106 calculates a first power limit value according to the SOC value of each of the battery racks 40 to 44 calculated (S604). The first power limit calculation unit 106 transmits the calculated first power limit value of each of the battery racks 40 to 44 to the second power limit calculation unit 110.

The capacity ratio calculation unit 108 calculates the capacity ratio of the corresponding battery rack to the total capacity of the plurality of battery racks (S606). The capacity ratio calculation unit 108 calculates all the capacity ratios of the corresponding battery rack to the capacity of each total battery rack of the plurality of battery racks. The capacity ratio calculation unit 108 transmits the calculated capacity ratio of each battery rack to the second power limit calculation unit 112.

The second power limit calculation unit 110 receives the first power limit value of each of the battery racks 40 to 44 from the first power limit calculation unit 106. In addition, the second power limit calculation unit 110 receives the capacity ratio of each of the battery racks 40 to 44 from the capacity ratio calculation unit 108.

The second power limit calculation unit 110 calculates the second power limit value using the first power limit value and the capacity ratio of the corresponding battery rack (S608). Specifically, the second power limit calculation unit 110 divides the first power limit of each battery rack by the capacity ratio of the corresponding battery rack. That is, the second power limit calculation unit 110 calculates a value obtained by dividing the first power limit of each battery rack by the capacity ratio of the corresponding battery rack as the second power limit value of each battery rack.

The second power limit calculation unit 110 transmits the calculated second power limit value of each battery rack to the bank power limit calculation unit 112.

The bank power limit calculation unit 112 receives the second power limit value of each of the battery racks 40 to 44 from the second power limit calculation unit 110.

The bank power limit calculation unit 112 calculates a battery bank power limit value using the second power limit value (S610). Specifically, the bank power limit calculation unit 112 calculates the smallest value of each received second power limit value as the bank power limit value.

When the bank power limit calculation unit 112 transmits the calculated bank power limit value to the transmission unit 114, the transmission unit 114 transmits the bank power limit value to a power conversion system (PCS) control unit 30.

The PCS control unit 30 receiving the bank power limit value from the transmission unit 114 controls the PCS based on the received bank power limit value.

Figure 7:
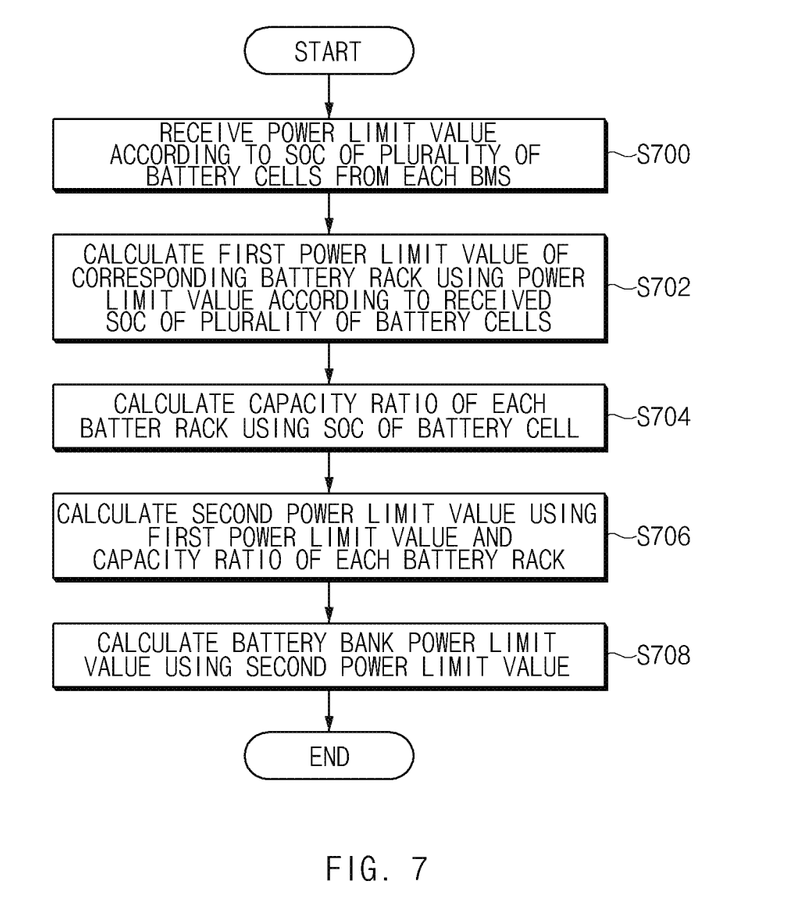
FIG. 7 is a flowchart of a method of calculating a battery bank power limit according to another embodiment of the present invention.

FIG. 7 is a flowchart of a method of calculating a battery bank power limit according to another embodiment of the present invention.

A battery management system that controls or monitors each battery rack is connected to each battery rack. Each of battery management systems 50 to 54 measures the voltage or current of each battery cell in a battery rack to which the corresponding battery management system is connected to calculate a power limit according to SOC of each battery cell. In addition, each of the battery management systems 50 to 54 transmits the power limit value according to the real-time SOC of the battery cells included in the battery rack to the battery bank power limit calculation device 11.

The reception unit 200 receives a power limit value according to a real-time SOC of a battery cell in a battery rack to which the corresponding battery management system is connected, from each of the battery management systems 50 to 54 (S700). The reception unit 200 transmits the power limit value according to the received real-time SOC of the battery cells in each battery rack to the first power limit calculation unit 206.

The first power limit calculation unit 206 calculates the smallest value among the power limit values of the battery cells in the corresponding battery rack as the power limit value of the corresponding battery rack by using the power limit value according to the received real-time SOC of a battery cell in each battery rack (S702). The first power limit calculation unit 206 transmits the first power limit value calculated for each battery rack to the second power limit calculation unit 210.

The capacity ratio calculation unit 208 calculates the capacity ratio of the corresponding battery rack to the total capacity of the plurality of battery racks. The capacity ratio calculation unit 208 calculates all the capacity ratios of the corresponding battery rack to the capacity of each total battery rack of the plurality of battery racks. The capacity ratio calculation unit 208 transmits the calculated capacity ratio of each battery rack to the second power limit calculation unit 210.

The second power limit calculation unit 210 receives the first power limit value of each of the battery racks 40 to 44 from the first power limit calculation unit 206. In addition, the second power limit calculation unit 210 receives the capacity ratio of each of the battery racks 40 to 44 from the capacity ratio calculation unit 208.

The second power limit calculation unit 210 calculates the second power limit value using the first power limit value of each battery rack and the capacity ratio of the corresponding battery rack (S706).

Specifically, the second power limit calculation unit 210 divides the first power limit of each battery rack by the capacity ratio of the corresponding battery rack. The second power limit calculation unit 210 calculates a value obtained by dividing the first power limit of each battery rack by the capacity ratio of the corresponding battery rack as the second power limit value of each battery rack. The second power limit calculation unit 210 transmits the calculated second power limit value of each battery rack to the bank power limit calculation unit 212.

The bank power limit calculation unit 212 calculates a battery bank power limit value using the second power limit value (S708). Specifically, the bank power limit calculation unit 212 calculates the smallest value of each received second power limit value as the bank power limit value.

When the bank power limit calculation unit 212 transmits the calculated bank power limit value to the transmission unit 214, the transmission unit 214 transmits the bank power limit value to a PCS control unit 30.

The PCS control unit 30 receiving the bank power limit value from the transmission unit 214 controls the PCS based on the received bank power limit value.

Reference herein to 'one embodiment' of the principles of the present invention and various modifications of such expressions means that, in relation to this embodiment, the specific features, structures, characteristics, and the like are included in at least one embodiment of the principles of the present invention. Thus, the expression 'in one embodiment' and any other modifications disclosed throughout the specification are not necessarily all referring to the same embodiment.

All the embodiments and conditional examples disclosed in this specification are described to intend to help those skilled in the art to understand the principles and concepts of the present invention, so that it will be understood by those skilled in the art that various changes in form and details may be made therein without departing from the spirit and scope of the present invention. Therefore, the disclosed embodiments should be considered in descriptive sense only not in limited perspective sense. The scope of the invention is defined not by the detailed description of the invention but by the appended claims, and all differences within the scope will be construed as being included in the present invention.

The invention claimed is:

1. A battery bank control device for setting a power limit value of a battery bank in which a plurality of battery racks are connected in parallel, the device comprising:
 a voltage measurement unit configured to measure a voltage of each battery rack of the plurality of battery racks;
 a first power limit calculation unit configured to calculate a first power limit value according to a state of charge (SOC) calculated based on the voltage of each battery rack with respect to each battery rack;
 a capacity ratio calculation unit configured to calculate a capacity ratio of each battery rack based on capacity information of the plurality of battery racks;
 a second power limit calculation unit configured to calculate a second power limit value using the capacity ratio and the first power limit value of each battery rack; and a battery bank power limit calculation unit configured to calculate a battery bank power limit value using the second power limit value of each battery rack.

2. The device of claim 1, further comprising an SOC calculation unit configured to calculate the SOC of each battery rack based on the voltage of each battery rack.

3. The device of claim 1, wherein the SOC of each battery rack is a value that changes in real time, and accordingly, the bank power limit value also changes in real time.

4. The device of claim 1, further comprising:
a temperature measurement unit configured to measure the temperature of each battery rack of the plurality of battery racks,
wherein, when calculating the SOC of each battery rack, the temperature of the respective battery rack is used.

5. The device of claim 1, wherein the second power limit calculation unit is further configured to calculate the second power limit value by dividing the first power limit value of each battery rack by the capacity ratio for the respective battery rack.

6. The device of claim 1, wherein the bank power limit calculation unit is further configured to calculate a smallest value among the second power limit values of each battery rack as the bank power limit value.

7. A method of setting power limit of a battery bank in which a plurality of battery racks are connected in parallel, the method comprising:
measuring a voltage of each battery rack of the plurality of battery racks;
calculating a first power limit value according to a state of charge (SOC) calculated based on the voltage of each battery rack with respect to each battery rack;
calculating a capacity ratio of each battery rack based on capacity information of the plurality of battery racks;
calculating a second power limit value using the capacity ratio and the first power limit value of each battery rack; and
calculating a battery bank power limit value using the second power limit value of each battery rack.

8. The method of claim 7, wherein the SOC of each battery rack is a value that changes in real time, and accordingly, the bank power limit value also changes in real time.

9. The method of claim 7, further comprising:
measuring the temperature of each battery rack of the plurality of battery racks,
wherein, when calculating the SOC of each battery rack, the temperature of the respective battery rack is used.

10. The method of claim 7, wherein the calculating of the second power limit value comprises calculating the second power limit value by dividing the first power limit value of each battery rack by the capacity ratio for the respective battery rack.

11. The method of claim 7, wherein the calculating of the battery bank power limit value comprises calculating a smallest value among the second power limit values of each battery rack as the bank power limit value.

\* \* \* \* \*